United States Patent [19]
Hepfer et al.

[11] Patent Number: 5,276,319
[45] Date of Patent: Jan. 4, 1994

[54] METHOD AND DEVICE FOR IMPROVED IR DETECTION WITH COMPENSATIONS FOR INDIVIDUAL DETECTOR RESPONSE

[75] Inventors: Kenneth C. Hepfer, Camp Springs, Md.; S. Roger Horman, Dahlgren, Va.; Bob Horsch, Fullerton, Calif.

[73] Assignee: The United States of America as represented by the United States Secretary of the Navy, Washington, D.C.

[21] Appl. No.: 871,779

[22] Filed: Apr. 21, 1992

[51] Int. Cl.$^5$ .............................................. H01J 40/14
[52] U.S. Cl. .................. 250/208.1; 250/332; 250/349
[58] Field of Search ................ 250/208.1, 227.24, 557, 250/562, 395, 370.09, 332, 334, 370.08, 338.4, 349; 356/386; 358/213.11, 213.17

[56] References Cited

U.S. PATENT DOCUMENTS

| | | | |
|---|---|---|---|
| 3,699,577 | 10/1972 | Shadle | 343/112 R |
| 3,710,353 | 1/1973 | Jacobs et al. | 340/173.2 |
| 4,449,044 | 5/1984 | Rotolante et al. | 250/211 |
| 4,536,658 | 8/1985 | Ludington | 250/578 |
| 4,656,517 | 4/1987 | Shida et al. | 358/213 |
| 4,661,713 | 4/1987 | Besson et al. | 250/578 |
| 4,728,804 | 3/1988 | Norsworthy | 250/578 |
| 4,767,937 | 8/1988 | Norsworthy | 250/578 |
| 4,806,761 | 2/1989 | Carson et al. | 250/332 |
| 4,864,137 | 9/1989 | Klein | 250/343 |
| 4,933,559 | 6/1990 | Tamura et al. | 250/338.3 |
| 4,940,895 | 7/1990 | Mansfield | 250/332 |
| 5,101,194 | 3/1992 | Sheffer | 341/567 |
| 5,144,149 | 9/1992 | Frosch | 250/493.1 |

Primary Examiner—David C. Nelms
Assistant Examiner—T. Davenport
Attorney, Agent, or Firm—John D. Lewis; Jacob Shuster

[57] ABSTRACT

An advanced infrared (IR) Sensor based on the present invention would add the following two elements to a basic staring IR sensor using a 2 dimensional array of detector elements to significantly enhance the detection sensitivity of the device. The added features are: (1) Additional optics or modification to the normal optics to scan the image over a small fraction of the array dimensions so that each point in the image is sampled by a number of different detector elements, and (2) signal processing to combine the multiple samples for each image point so as to exclude the effects of "dead", "weak" or excessively noisy detector elements and average out the element to element sensitivity variations and calibration/correction imperfections of the "normal" elements. The effect of this process would be to provide an output which contained no "dead" picture elements (pixels), with root-mean-square (RMS) spatial noise reduced by approximately a factor of the square root of the number of image samples averaged and with dramatic suppression of the extreme values in the output variation statistics. In addition, the performance improvements outlined above can be accomplished using detector arrays having a large number of bad elements which would normally make them unacceptable for use.

8 Claims, 3 Drawing Sheets

METHOD AND DEVICE FOR IMPROVED IR DETECTION WITH COMPENSATIONS FOR INDIVIDUAL DETECTOR RESPONSE

The invention defined herein may be used by or for the Government of the United States of America for governmental purposes without the payment of royalties thereon or therefor.

BACKGROUND OF THE INVENTION

The invention relates to the field of infrared sensors in which infrared radiation is detected with an array of photodetectors, converted to electrical signals and then electronically displayed, recorded or used for automatic detection and/or track of targets. Major fields of use include night vision devices such as the forward looking infrared (FLIR) systems, surveillance systems, and sensor/tracking systems for weapon control. The invention finds greatest utility in detecting extremely weak objects or objects whose emitted radiation has been strongly attenuated by atmospheric conditions and in using detector arrays with a substantial number of defective elements. Prior art systems are known to use two-dimensional arrays and scanners along with coolers for detectors and focusing optics. These are the common building blocks of modern infrared sensors. Pat. No. 4,806,761 to Carson et al. employs a two-dimensional detector array which is carried by and mounted on the focal plane of an optical/electronics module which has embedded in it amplifying, filtering and multiplexing circuitry utilizing MOSFET transistors. Carson et al. suggests use of a limited nutation scanning mode to modulate the incoming radiation and to allow comparison and calibration to remove the low frequency (1/f) noise from the lead selenide photodetectors. The main thrust of the Carson et al. device is to achieve acceptable performance out of inexpensive detector materials by using Z-technology electronics packaging and signal chopping/scanning to solve problems of excessive low frequency (1/f) noise and overcome the inherent low sensitivity of lead selenide photodetectors.

Another prior art Pat. No. 4,728,804 to Norsworthy employs a scanner and multiplexer to reduce processor complexity and the number of electrical connections required between the elements of the sensor.

Another prior art Pat. No. 4,767,9374 to Norsworthy employs a scanner and special detector array geometry to permit a high frame rate with reduced target scan rate, reduced processor complexity as well as reducing the number of electrical connections required between the elements of the sensor.

Problems associated with the patents discussed above and the prior art in general is an inability to fully benefit from the use of high density two-dimensional arrays of the most sensitive photodetector materials such as HgCdTe, InSb, etc. Prior art devices using high density two-dimensional arrays of highly sensitive detector materials ar limited by the spatial noise or residual detector nonuniformity which remains even after array calibration and normal electronic correction. Prior art devices also suffer from an inability to remove the effect of dead or totally nonfunctioning detector elements. Although some cosmetic improvement to the images may be made by electronics, missing information is still missing.

It is very difficult or costly to build large two-dimensional arrays of detectors from some materials where all the detectors have an acceptable responsivity and noise level. As a result, the majority of highly sensitive large format focal plane arrays have some detectors which are "dead" or "weak" or "noisy". "Dead" detectors have either no measurable responsivity or responsivity of an extremely low level. "Weak" detectors have measurable responsivity, but it is so low that an unacceptably noisy signal results after amplification. "Noisy" detectors may have normal responsivity but they have a noise level significantly greater than the array average. Even acceptable detector elements have a range of responsivities and hence produce a nonuniform display with spatial (fixed pattern) noise. Spatial noise from acceptable detectors can be (and normally is) partially corrected by a 2 (or sometimes 3) point linear correction process. However, such processes are inexact, and result in residual errors from several sources.

A major feature of Applicants' invention is the ability to use a photodetector array that otherwise would be unacceptable due to the number of defective or out of tolerance elements and still get a high level of performance. For instance, one faced with equipment design could spend the resources to use a photodetector array that was 99.9 percent defect free with associated problems and costs in attempting to obtain a near perfect array or could use Applicants' method and/or device to obtain superior results with an array that is only 95 percent defect free.

Thus, it is an object of this invention to reduce spatial noise resulting from residual compensation errors.

A further object is to teach a method and device to reduce or eliminate the effects of dead, weak or noisy photodetectors which view or scan an image point.

It is a further object to teach an Advanced IR Sensor which more fully benefits from large, high density, high quantum efficiency photodetector arrays made from such materials as HgCdTe and InSb.

Yet another object is to teach a method of obtaining high performance from a photodetector array with reduced costs.

It is still a further object of the present invention to teach a system which addresses the effects of spatial defects and nonuniformity which remain after gain and level correction.

SUMMARY OF THE INVENTION

These and other objects are met by the Advanced IR Sensor of the present invention. The Advanced IR Sensor includes the normal elements of what is commonly called a "staring IR sensor" which includes a two-dimensional IR photodetector array with associated support components as needed to produce an electric signal for each element which is generally proportional to the intensity of IR radiation falling on that element; optics to focus an image of the IR scene onto the surface of the photodetector array, and signal processing electronics to correct for element to element nonuniformities and format the signals for display or other uses. An advanced IR Sensor based on the present invention would add the following two elements to the basic staring sensor previously described to significantly enhance the detection sensitivity of the device. The added features are: (1) Additional optics or modification to the normal optics to scan the image over a small fraction of the array dimensions so that each point in the image is sampled by a number of different detector elements, and (2) signal processing to combine the multiple samples for each image point so as to exclude the effects of "dead", "weak" or excessively noisy detector elements and average out the element to element sensitivity variations and calibration/correction imperfections of the "normal" elements.

The effect of this process would be to provide an output which contained no "dead" picture elements (pixels) and which reduced RMS spatial noise by approximately a factor of the square root of the number of image samples averaged. In addition to the reduction in the magnitude of the average (RMS) noise, the averaging process and exclusion of dead and excessively noisy detectors would provide dramatic suppression of the extreme values in the output variation statistics. This reduction in extreme noise is of even greater benefit (to an automatic detection sensor) than is the reduction in average noise. It is frequently the extreme noise values which cause false detections.

In addition, the performance improvements outlined above can be accomplished using detectors arrays having a large number of bad elements which would normally make them unacceptable for use. Thus, the method of this invention offers the potential for both performance enhancement and cost savings.

This embodiment and other variations will best be understood when read with a general description in conjunction with the following drawings.

IN THE DRAWINGS

DETAILED DESCRIPTION

Figure 1:
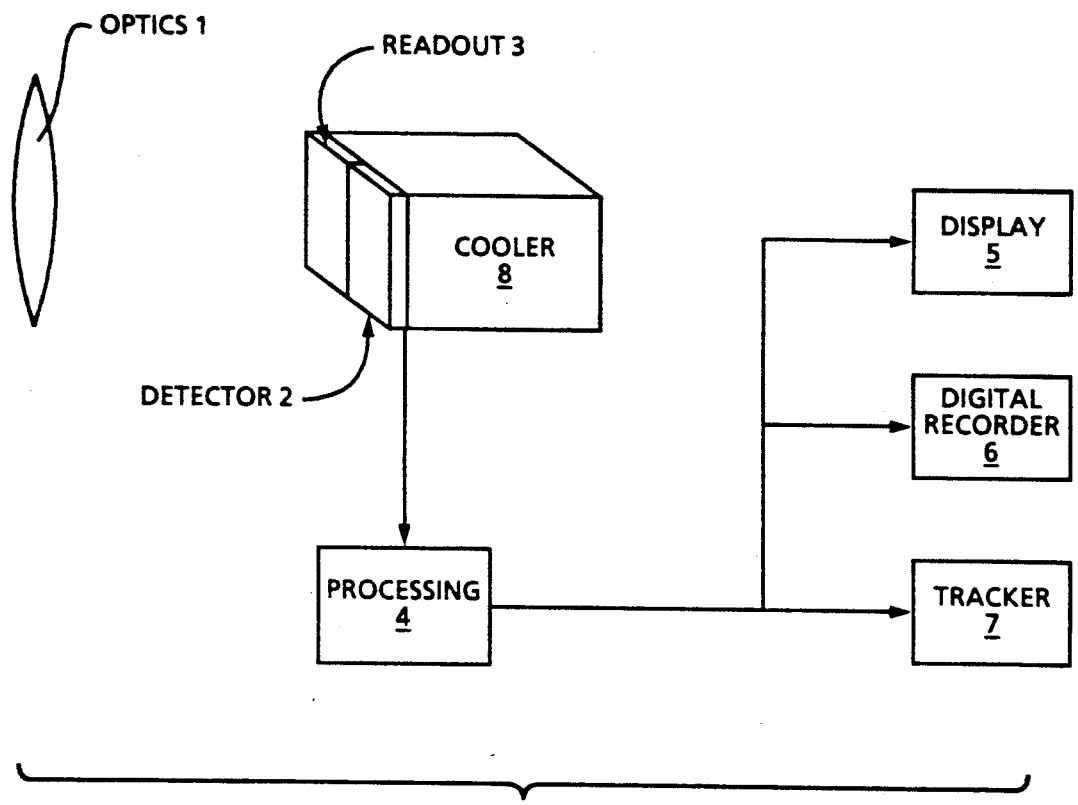
FIG. 1 is a block diagram of a prior art conventional staring imaging sensor using two-dimensional focal plane array.

Turning now to FIG. 1, the basic elements of a 2-Dimensional Focal Plane Array (2D-FPA) based staring imaging sensor are shown. Therein the optics 1 focus the incoming radiation to produce a real image on the detective area 2 of the two-dimensional focal plane array. Because the photodetective array will normally require operation at temperatures significantly below ambient, a cryogenic refrigerator (cooler) 8 will be needed to maintain the detector array at its normal operation temperature. The detective area consists of a two-dimensional array of detector elements. Each detector element converts incoming signal (photons) into electrical signal (electrons). For some period of time (integration time) the signal electrons are collected and stored in the vicinity of the detector element. Following the integration time, readout electronics on the array 3 and signal processing electronics external to the array 4 are used to convert each detector's output into a digital number. As part of the normal signal processing, the output of each detector element is adjusted to compensate for element to element non-uniformities using a stored array of correction coefficients, and the resulting corrected values are stored into a digital memory array. At this point, each FPA detector element has an associated digital memory location with the value of the number stored in the digital memory location being proportional to the image intensity falling on the associated detector element. This digital representation of the IR image is read out and further processed as required for such uses as operator display 5, image recording 6 and automatic target detection and tracking 7. The entire process is typically repeated 30 times (frames) each second to produce real time imagery and target track signals.

An infrared sensor utilizing a two-dimensional focal plane array has the potential for extremely high detection sensitivity. In theory, all the target signal (photons) which enters the system aperture during the frame time can be collected by the detector array. In practice, the achieved sensitivity of a sensor is many times less than is theoretically possible. Two factors which significantly limit the detection sensitivity of a 2D-FPA based sensor are bad detector elements and fixed pattern noise.

Bad detector elements can be a problem in even the best arrays. Typically, each array will have some small number of detector elements which have performance significantly less than the array average. These elements may be dead, i.e., produce no output, or may simply produce an excessive amount of noise.

The second factor, fixed pattern noise, is where each detector element of the array produces slightly different output for the same input. This variation is correctable only in part. By measuring the response of each detector element under uniform image conditions (calibration), it is possible to apply an electronic correction to each element's output and thereby reduce fixed pattern noise to something on the order of 0.1 percent. Even at this very low level, the residual fixed pattern noise will significantly reduce the potential detection sensitivity of the sensor.

Figure 2:
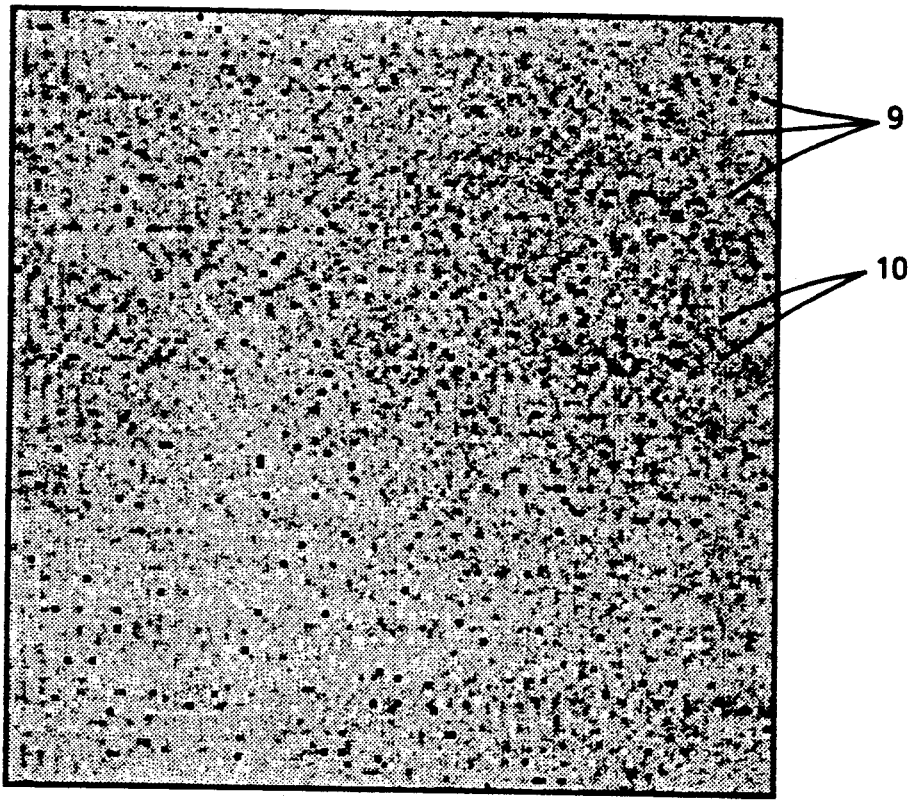
FIG. 2 is an illustration of the output of an uncompensated focal plane array with approximately 0.79% dead elements.
Figure 3:
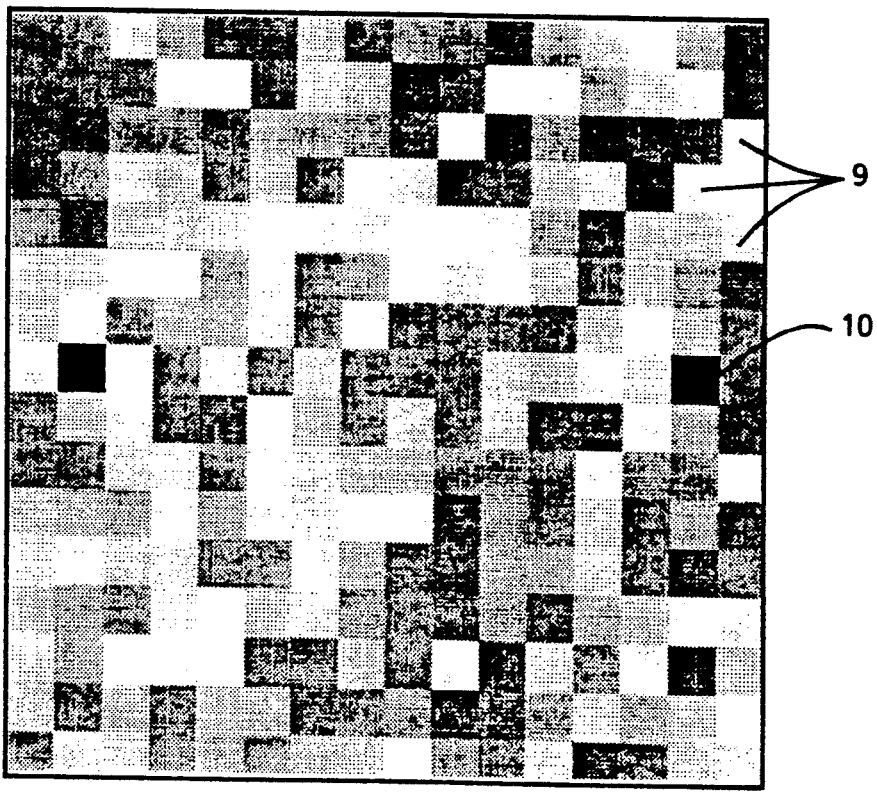
FIG. 3 is an enlarged illustration of a part of the output of an uncompensated focal plane array with 0.78% dead elements.

With current technology, it is not practical to produce large "perfect" infrared focal plane arrays using the most sensitive detector materials. In even a high quality or selected array, a small fraction of the elements (typically less than 1%) will be dead, and the remaining elements will have significant variation in sensitivity about the average. FIG. 2 illustrates what the output of a typical starring FPA might look like without any compensation. The element to element sensitivity variations will give the displayed image a mottled appearance 9 and the dead detector elements will block portions of the imaqe 10 from the display. The net effect would be like looking through a dirty window with specks of black paint on it. FIG. 3 is a close-up of a 16 by 16 element portion of FIG. 2 which more clearly shows varying shades of grey due to normal element to element image variation 9 and no image from dead elements 10. FIG. 3 is an artist conception, and an actual array would have many more individual shades of grey than are illustrated by these figures. The normal approach is to "calibrate" each element of the array and "correct" the output so that a uniform scene will produce a uniform output. Of course, dead detectors cannot be corrected, and there will be some detectors which will produce significantly greater noise than an average detector. In addition, the calibration/correction process is not perfect, and there will remain some residual fixed pattern noise in the output. When the gain (contrast) of the display is increased to allow viewing of extremely weak objects, the residual fixed pattern noise will again become visible and will limit the sensor's ultimate performance. The net effect is that current infrared 2D-FPA sensors (a) have average (sensor level) sensitivity significantly less than the average detector in the array is capable of and (b) have significant variation in detection sensitivity from element to element. This variation in sensitivity has a very detrimental effect on the detection capability of a sensor. The relatively small number of elements with greater than average noise will tend to produce the majority of the false detections.

Figure 4:
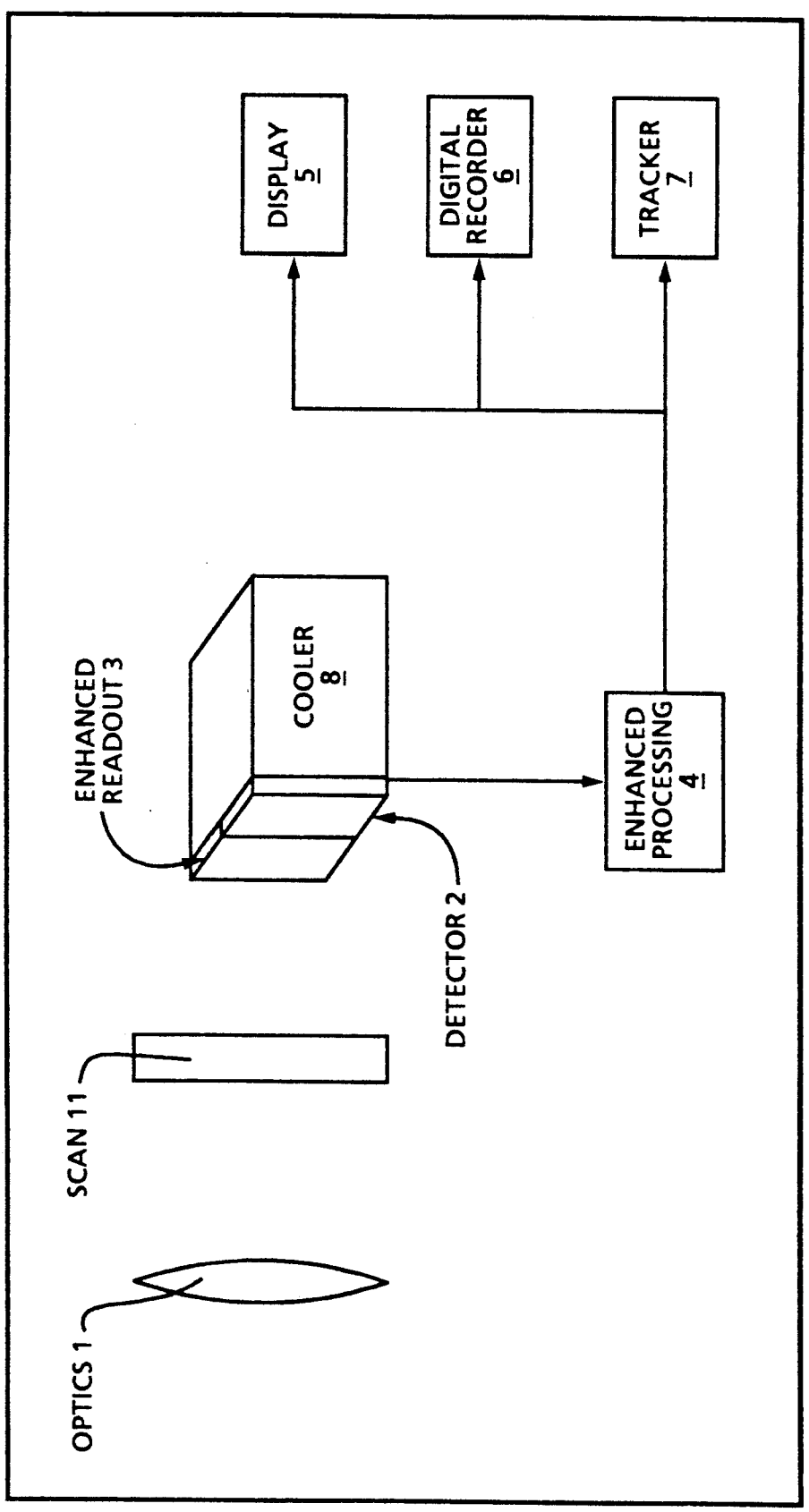
FIG. 4 is a block diagram of one embodiment of the Advanced IR Sensor of the present invention.

These problems are addressed and may be understood by turning to FIG. 4. Therein, optical elements 11 scan the image over a small fraction of the array dimensions so that each point in the image is sampled by a number of different detector elements, and signal processing 4 is used to combine the multiple samples so as to average out the element to element sensitivity variations and calibration/correction imperfections.

To make this process clear, a specific example will be described in which the image scan is linear step-stare and covers 16 pixels in one frame time.

A linear step-stare scanner 11 placed in the optical path would sequentially shift the field of view by one detector subtense sixteen times. At each scan stare position, the array would be read out and the (sub-frame) output corrected. Then in external signal processing 4, each sub-frame would be shifted by an amount appropriate for its associated scan offset and the results would be added, pixel by pixel, to create a frame image. Detector elements with performance below some pre-established threshold (dead or excessively noisy) would not be included in the sum. The sum at each location in the frame image would be divided by the number of detector elements which contributed to that sum to produce an averaged frame image.

After this process has been completed, the spatial noise in the image due to residual errors in the compensation process will have been reduced by the averaging and the effects of dead or noisy detectors will be removed by discarding the signal from these detectors and averaging the responses of the others which scan that point. For example, if the scene is sequentially stepped by one detector angular subtense 16 times and the results averaged, spatial noise will be reduced by a factor of the square root of 16, or 4 in the case where none of the detectors scanned over a point are dead or noisy. As another example, if two of the 16 detectors mentioned above were dead or noisy, the signals from these detectors would be discarded and the signals from the remaining 14 averaged. For points in the field of view previously covered by good detectors, this would still result in an improvement in the spatial noise by a factor of the square root of 14, or about 3.74. For a pixel previously covered by a noisy detector, the relative improvement would be much greater and for a pixel previously covered by a dead detector, the relative improvement would be infinite. Therefore, unless large areas of detectors are dead or noisy, this process will result in imagery that has a noise level and responsivity at each point that is comparable to that of the array average. In sensors not using Applicants' process, noisy detectors would have noise levels much greater than the array average and no useful information would be available from points in the field of view covered by dead detectors.

Applicants' invention may be practiced with varying hardware. For example, the dither scan mechanism 11 need not be separate from the focusing optics 1 but rather both functions could be accomplished with the same elements. If the optical design were to include a folding mirror (for example to reduce overall size), then small angular displacements of that folding mirror could be used to accomplish the dither scan. Many other techniques involving linear or angular displacement of optical elements could be used to accomplish the dither scan motion and the number of detector element outputs averaged for each image point could be different than the 16 quoted in the above example.

In another embodiment, the number of detector element outputs averaged for each image point could be variable based on the sensor characteristics desired at a particular time. For example, for detecting a target at long range, the number of elements averaged could be large to give the sensor very good sensitivity, but with a low overall frame rate. For tracking a target at shorter range, the number of elements averaged could be reduced giving up sensitivity but gaining an increased frame rate, which would improve the ability to follow target motion.

It is intuitive to one of ordinary skill in the art that the scan pattern need not be linear but could involve motion in two dimensions. Likewise, the step size between samples need not be in integer units of detector spacing. If the step size were in integer units of ½ the detector spacing (in two dimensions), then the output image frame could have twice the sample spacing resolution in each dimension.

As another example of design choice, the dither scan pattern could be continuous rather than step-stare. In this case, the average image position of the detector element over the signal integration time would be used to determine which memory location should be used to store or sum the corrected detector output.

It is important to note that the dither scan pattern need not precisely match the detector element center to center pattern. For example, a continuous circular scan pattern with integration samples equally spaced in time could be used to closely (but not perfectly) match a detector array with elements spaced on a square grid. Another possible variation would be a linear continuous or step-stare pattern with scan direction tilted such that four samples would result in motion of 6 pixels in one dimension and 1 pixel in the other dimension. Each sample would therefore result in motion of 1.5 pixels in one dimension and, 0.25 pixels in the other dimension. If the output image grid had 0.5 pixel sample spacing, and each corrected sample were stored or summed into the nearest location, then the net result would be an output image frame with twice the sample spacing resolution in each dimension.

As another possible embodiment, the dither scan pattern need not be tightly controlled as long as the scan position can be measured. In this case, the corrected, integrated signal from a given detector element would be stored or summed into the image array position which was closest to the average detector element position over the signal integration time.

As another example considered to be design choice, the detector array need not have elements spaced on a square or rectangular grid, but might have the elements spaced to optimize scan geometry.

The hardware design parameters will suggest other hardware designs which practice Applicants' method and remain within the scope of the invention. The method involves focusing an incoming IR image onto a two-dimensional IR detector array and then reading the electrical output from each detector element into a correctional device where any individual detector element variations are compensated. The corrected signals, from detector elements considered to be within preselected standards, are then stored as a subframe. The optical dither scanner next shifts the IR image on the two-dimensional IR detector array and the corrected signals from that second subframe are shifted in storage memory by a amount corresponding to the shift of the image. This shifted image is similar to the first, except that any particular point within the IR image falls on a different detector than that of the first image. Therefore, when the second subframe is summed with the first subframe, a sum subframe is created that is very similar to both, except that the value associated with an particular point in the resultant summed subframe contains contributions from two detector elements. This process is repeated a number of times, until the summed image contains output from the desired number of separate detector elements. As this process is performed, a record is kept of how many detectors contributed to each point within the resultant summed frame of data. These numbers are then used to calculate the average subframe value at each point in the frame. The resultant image frame is then free from the anomalies created by dead or out of tolerance detector elements. The entire process then is repeated, traditionally, but not limited to, 30 times per second, to provide an ultrasensitive IR imaging technique that is free of output variation and contains no "dead" pixels.

From the foregoing description, it will be apparent that the apparatus embodiments disclosed in this application will provide the significant functional benefits summarized in the introductory portion of the specification. The disclosed physical embodiments are considered the best mode known to Applicants to practice the hereinabove described method, but it is understood that many hardware variations may be made without departing from the scope of Applicants' method.

The following claims are intended not only to cover the specific embodiments disclosed, but also to cover the inventive concepts and method explained herein with the maximum breadth and comprehensiveness permitted by the prior art.

What we claim:

1. A method of processing an IR signal comprising the steps of:
   a. focusing an incoming IR image onto a two-dimensional IR detector array;
   b. reading the corresponding electrical signal from each detector element of the two-dimensional array;
   c. correcting the signals read in step b. to compensate for variations in the response of the individual detector elements;
   d. storing the corrected signals from elements whose performance falls within accepted standards, then
   e. scanning the incoming IR image focus in step a. in a step-stare manner so that each image point sequentially falls on a number of different detector elements, then
   f. storing and summing the corrected signals from elements whose performance falls within accepted standards with the stored signals from step d. so that the same image points are stored and summed together, even though read from different detectors.
   g. repeating steps e. and f. to accumulate signals from the desired number of separate detector elements; then
   h. dividing the accumulated signal stored for each image point by the number of samples which contributed to the sum for that image point.
   i. repeat steps a. through h. in the next time increment.

2. An advanced IR sensor for use in applications requiring extreme sensitivity for detecting weak targets or targets attenuated by atmospheric conditions comprising:
   a two-dimensional array of separate photodetectors forming a focal plane array to convert incoming infrared radiation to a proportional electrical impulse representing the cumulative radiation incident on each of said photodetector elements; and
   means for cooling and otherwise conditioning said photodetector array for proper operation; and
   an optical assembly to focus the IR image on said two-dimensional array; and
   means to selectively shift the IR image so that each image point is sampled by a number of photodetectors on said two-dimensional array; and
   means for processing whereby the signals from each photodetector in said two-dimensional array are evaluated, with only the signals from detectors having performance falling within accepted standards being included in the average for each image point whereby the output signal is free of defects produced by weak or non-functioning detector elements.

3. A method according to claim further defined by an additional step of displaying the image obtained from step h.

4. A method according to claim 1 further defined by an additional step of recording the image obtained from step h.

5. An advanced IR sensor according to claim 2 wherein said two-dimensional array is comprised of HgCdTe detector elements.

6. An advanced IR sensor according to claim 2 wherein said two-dimensional array is comprised of InSb detector elements.

7. An advanced IR sensor according to claim 2 wherein said means for cooling is a cryogenic refrigerator.

8. An advanced IR sensor according to claim 2 wherein said optical assembly includes a folding mirror which is displaced to selectively shift the IR image, thus combining said optical assembly and said means to selectively shift into a single element.

* * * * *